(12) United States Patent
Kim (10) Patent No.: US 9,704,926 B2
(45) Date of Patent: Jul. 11, 2017

(54) ORGANIC LIGHT-EMITTING DISPLAY APPARATUS

(71) Applicant: Samsung Display Co., Ltd., Yongin, Gyeonggi-Do (KR)

(72) Inventor: Sung-Hoon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/275,850

(22) Filed: May 12, 2014

(65) Prior Publication Data

US 2015/0162391 A1 Jun. 11, 2015

(30) Foreign Application Priority Data

Dec. 10, 2013 (KR) .................. 10-2013-0153313

(51) Int. Cl.
*H01L 27/32* (2006.01)
*H01L 51/52* (2006.01)

(52) U.S. Cl.
CPC ...... *H01L 27/3218* (2013.01); *H01L 27/3246* (2013.01); *H01L 51/525* (2013.01)

(58) Field of Classification Search
CPC ............. H01L 27/3218; H01L 27/3246; H01L 51/525
USPC ........................................................ 313/509
See application file for complete search history.

(56) References Cited

U.S. PATENT DOCUMENTS

| | | | |
|---|---|---|---|
| 2002/0015110 A1* | 2/2002 | Brown Elliott ............... | 348/589 |
| 2003/0127657 A1* | 7/2003 | Park ..................... | H01L 27/3246 257/79 |
| 2008/0001525 A1* | 1/2008 | Chao et al. ................... | 313/500 |
| 2008/0030128 A1* | 2/2008 | Kim .............................. | 313/504 |
| 2008/0287028 A1* | 11/2008 | Ozawa ............................ | 445/24 |
| 2012/0268699 A1 | 10/2012 | Min et al. | |
| 2012/0313123 A1 | 12/2012 | Kim | |
| 2014/0319479 A1* | 10/2014 | Park ..................... | H01L 51/525 257/40 |

FOREIGN PATENT DOCUMENTS

| | | |
|---|---|---|
| KR | 10-2005-0008770 A | 1/2005 |
| KR | 10-2006-0055052 A | 5/2006 |
| KR | 10-2011-0085471 A | 7/2011 |
| KR | 10-2012-0119370 A | 10/2012 |
| KR | 10-2012-0136651 A | 12/2012 |

* cited by examiner

*Primary Examiner* — Nimeshkumar Patel
*Assistant Examiner* — Christopher Raabe
(74) *Attorney, Agent, or Firm* — Lewis Roca Rothgerber Christie LLP (57) ABSTRACT

An organic light-emitting display apparatus is provided. The organic light-emitting display apparatus includes: a display substrate including a non-pixel area and a plurality of pixel areas including a first pixel and a second pixel having a shortest distance from the first pixel among pixels of the plurality of pixel areas; an encapsulation substrate facing the display substrate; and a spacer in the non-pixel area of the display substrate to maintain a space between the display substrate and the encapsulation substrate, wherein the spacer is between the first pixel and the second pixel.

18 Claims, 6 Drawing Sheets

ORGANIC LIGHT-EMITTING DISPLAY APPARATUS

CROSS-REFERENCE TO RELATED APPLICATION

This application claims priority to and the benefit of Korean Patent Application No. 10-2013-0153313, filed on Dec. 10, 2013, in the Korean Intellectual Property Office, the disclosure of which is incorporated herein in its entirety by reference.

BACKGROUND

1. Field

One or more embodiments of the present invention relate to an organic light-emitting display apparatus.

2. Description of the Related Art

An organic light-emitting display apparatus is a self-emitting type display apparatus including an organic light-emitting diode (OLED) including a hole injection electrode, an electron injection electrode, and an organic emission layer therebetween, wherein excitons, which are generated by holes injected from the hole injection electrode and electrons injected from the electron injection electrode being united in the organic emission layer, emit light by falling from an excited state to a ground state.

Since no additional light source is needed for the organic light-emitting display apparatus due to being a self-emitting type display apparatus, the organic light-emitting display apparatus may be driven at a low voltage and may be light-weight and thin. In addition, with its superior characteristics, such as wide viewing angles, excellent contrast, and short (e.g., fast) response times, the organic light-emitting display apparatus has drawn attention as a next generation display apparatus.

Generally, the organic light-emitting display apparatus includes a plurality of pixels, each of which emits one of a plurality of colors of light. The light emitted by the plurality of pixels forms an image.

Here, the pixel denotes the smallest unit that displays an image. A plurality of power lines may drive each of the pixels, for example, a gate line, a data line, and/or a driving power line. An insulating layer may define an area or a shape of each of the pixels (e.g., a pixel-defining layer) and may be disposed between neighboring pixels.

Also, the organic light-emitting display apparatus may employ a spacer to reduce deterioration of display characteristics caused by external shocks.

SUMMARY

One or more embodiments of the present invention include an organic light-emitting display apparatus.

Additional aspects will be set forth in part in the description which follows and, in part, will be apparent from the description, or may be learned by practice of the presented embodiments.

According to one or more embodiments of the present invention, an organic light-emitting display apparatus may include: a display substrate including a non-pixel area and a plurality of pixel areas including a first pixel and a second pixel having a shortest distance from the first pixel among pixels of the plurality of pixel areas; an encapsulation substrate facing the display substrate; and a spacer in the non-pixel area of the display substrate to maintain a space between the display substrate and the encapsulation substrate, wherein the spacer is between the first pixel and the second pixel.

The plurality of pixel areas may further include a third pixel. The second pixel may have a center point at a first vertex of a virtual quadrangle. The virtual quadrangle having a center point of the first pixel as its center point. A center point of the first pixel may be the center point of the virtual quadrangle. The third pixel may have a center point at a second vertex of the virtual quadrangle. The second vertex may neighbor the first vertex.

A distance between the first pixel and the second pixel may be substantially the same as a distance between the first pixel and the third pixel. The spacer may be between the first pixel and the third pixel.

The second pixel may be one of a plurality of second pixels and the third pixel may be one of a plurality of third pixels, and the plurality of second pixels and the plurality of third pixels may be alternately arranged on a virtual straight line.

Each of the first, second, and third pixels may emit a different color of light.

The first pixel may emit a green light, and may have a smaller area than the second pixel and the third pixel.

The organic light-emitting display apparatus may further include a pixel-defining layer that defines the plurality of pixel areas and the non-pixel area and includes openings for exposing the plurality of pixel areas. A sloped surface of the spacer may extend from a sloped surface of one of the openings of the pixel-defining layer.

The spacer may be formed of the same material as the pixel-defining layer.

The spacer may meet a boundary surface of the first pixel and a boundary surface of the second pixel.

A shape of a top view of the spacer may include at least one of a polygon, a circle, and an oval.

The second pixel may be one of a plurality of the second pixels of the plurality of pixel areas, and the plurality of second pixels may be spaced from one another with the first pixel therebetween.

The spacer may be one of a plurality of spacers and the plurality of spacers may be regularly arranged.

According to one or more embodiments of the present invention, an organic light-emitting display apparatus includes: a display substrate including a plurality of pixel areas and a non-pixel area; an encapsulation substrate facing the display substrate; and a spacer in the non-pixel area to maintain a space between the display substrate and the encapsulation substrate, wherein the plurality of pixel areas includes: a first pixel; a second pixel including a center point at a first vertex of a virtual quadrangle including a center point that is the same as a center point of the first pixel; and a third pixel that is spaced from the second pixel and has a center point at a second vertex of the virtual quadrangle wherein the second vertex is neighboring the first vertex, and wherein the spacer is between the first pixel and at least one of the second pixel and the third pixel that are neighboring the first pixel.

The spacer may meet a boundary surface of the first pixel.

The spacer may be one of a plurality of spacers and four of the plurality of spacers may meet a boundary surface of the first pixel.

The organic light-emitting display apparatus may further include a pixel-defining layer in the non-pixel area of the display substrate and including a plurality of openings through which the plurality of pixels are exposed.

The spacer may extend toward the encapsulation substrate from the pixel-defining layer.

A sloped surface of the spacer may extend from a sloped surface of one of the openings of the pixel-defining layer.

The spacer may be formed of the same material as the pixel-defining layer.

The spacer and the pixel-defining layer may be simultaneously formed using a half tone process.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Reference will be made in detail to example embodiments of the present invention, with reference to the accompanying drawings, wherein like reference numerals refer to like elements throughout. In this regard, embodiments of the present invention may have different forms and should not be construed as being limited to the descriptions set forth herein. Accordingly, the example embodiments of the present invention are merely described below, by referring to the figures, to explain aspects of embodiments of the present invention. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These designations are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" another layer, region, or component, it can be directly or indirectly on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
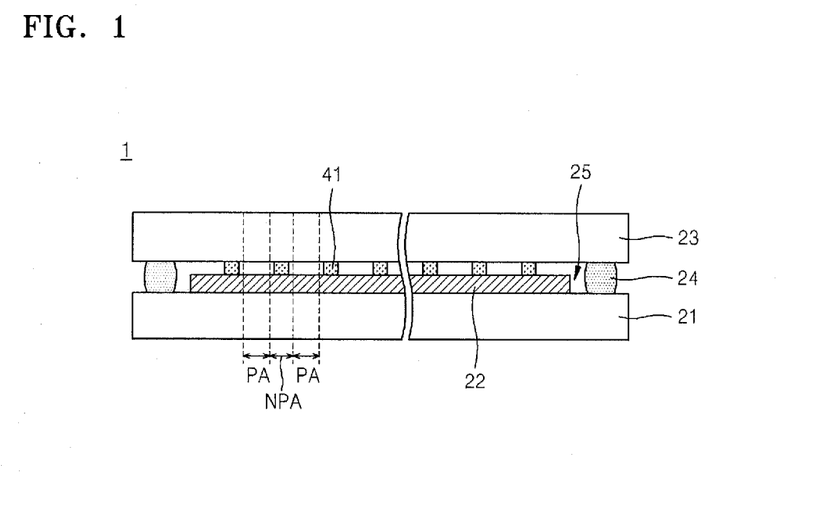
FIG. 1 is a cross-sectional view schematically illustrating an organic light-emitting display apparatus according to an embodiment of the present invention.

FIG. 1 is a cross-sectional view schematically illustrating an organic light-emitting display apparatus 1 according to an embodiment of the present invention.

Referring to FIG. 1, the organic light-emitting display apparatus 1 includes an organic emission portion 22 provided on a display substrate 21 and an encapsulation substrate 23 encapsulating the organic emission portion 22. Also, the organic light-emitting display apparatus 1 includes a spacer 41 disposed between the display substrate 21 and the encapsulation substrate 23 to maintain a space between the display substrate 21 and the encapsulation substrate 23.

The organic emission portion 22 is provided on the display substrate 21. The organic emission portion 22 and the display substrate 21 include a non-pixel area NPA and a plurality of pixel areas PA separated by the non-pixel area NPA.

The non-pixel area NPA is a region in which light is not visible. The non-pixel area NPA may be a non-emission region. Thus, the non-pixel area NPA may include no emission structure for light emission. According to some embodiments, the non-emission region may be a region in which light emission is blocked by a light shield structure, while at least partially including an emission structure.

The pixel area PA is a region in which light is visible. The pixel area PA may include an emission structure. For example, each of the plurality of pixel areas PA may include an organic light-emitting diode (OLED) achieving organic emission. The plurality of pixel areas PA may be arranged in a matrix-shape.

The organic emission portion 22 may include a plurality of OLEDs emitting lights of any of red, green, blue, and white colors. This will be described in further detail later below.

The encapsulation substrate 23 may be formed as a transparent member in order to realize an image from the organic emission portion 22 and may function to prevent penetration of oxygen and water into the organic emission portion 22.

Edges of the display substrate 21 and the encapsulation substrate 23 are combined by a sealing member 24. Accordingly, an inner space 25 between the display substrate 21 and the encapsulation substrate 23 is encapsulated. A moisture absorbing material or a filling member may be placed in the inner space 25.

The spacer 41 is disposed in the non-pixel area NPA. The spacer 41 is disposed between the display substrate 21 and the encapsulation substrate 23 to maintain a space between the display substrate 21 and the encapsulation substrate 23.

The spacer 41 may be provided so that display characteristics are not deteriorated due to external shocks.

Figure 2:
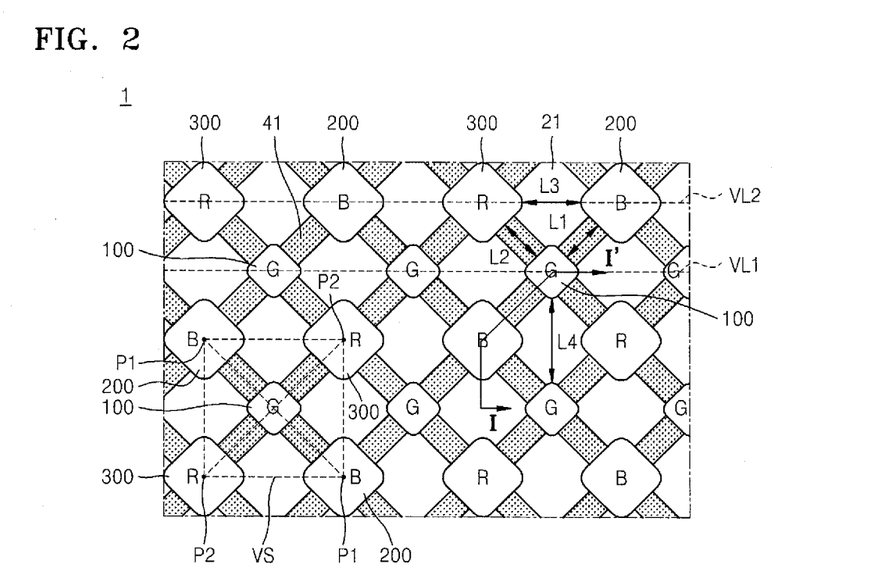
FIG. 2 is a partial plan view of the organic light-emitting display apparatus of FIG. 1.

FIG. 2 is a partial plan view of the organic light-emitting display apparatus 1 of FIG. 1.

Referring to FIG. 2, the plurality of pixel areas PA of the organic light-emitting display apparatus 1 include a plurality of first pixels 100, a plurality of second pixels 200, and a plurality of third pixels 300.

The first pixels 100 may have a smaller area than the neighboring second and third pixels 200 and 300, and may have a quadrangular shape or other polygonal shapes. In this specification, a polygon or a quadrangle includes a shape that has rounded vertices. For example, the first pixel 100 may have a quadrangular shape that has rounded vertices.

There may be a plurality of the first pixels 100 and each of the plurality of first pixels 100 may have an identical quadrangular shape. The plurality of first pixels 100 are arranged on a first virtual straight line VL1, while being spaced from one another. The first pixels 100 may emit a green light and may include an organic emission layer emitting a green light.

The second pixel 200 is at a first vertex P1 of a virtual quadrangle VS having the first pixel 100 as its center point. The third pixel 300 is at a second vertex P2 of the virtual quadrangle VS. The quadrangle VS may be a square.

The second pixel 200 is spaced from the first pixel 100 and has a center point at the first vertex P1 of the virtual quadrangle VS. The second pixel 200 may have a larger area than the neighboring first pixel 100 and may have a quadrangular shape or other polygonal shapes. There may be a plurality of the second pixel 200 and each of the plurality of second pixels 200 may have an identical quadrangular shape. The plurality of second pixels 200 may be spaced from one another with the first pixels 100 therebetween. The second pixel 200 may emit a blue light and may include an organic emission layer emitting a blue light.

The third pixel 300 is spaced from the first pixel 100 and the second pixel 200 and has a center point at the second vertex P2 of the virtual quadrangle VS that is neighboring the first vertex P1 of the virtual quadrangle VS. The third pixel 300 may have a larger area than the neighboring first pixel 100. The third pixel 300 may have the same area as the second pixel 200, and may have a quadrangular shape or other polygonal shapes. There may be a plurality of the third pixel 300 and each of the plurality of third pixels 300 may have an identical quadrangular shape. The plurality of third pixels 300 may be spaced from one another with the first pixels 100 therebetween. The third pixel 300 may emit a red light and may include an organic emission layer emitting a red light.

The plurality of third pixels 300 and the plurality of second pixels 200 are alternately arranged on a second virtual straight line VL2. Accordingly, the plurality of second pixels 200 having the center point at the first vertex P1 and the plurality of third pixels 300 having the center point at the second vertex P2 surround the first pixels 100.

According to the arrangement of the plurality of pixels as shown above, gaps of a first length L1, a second length L2, and a third length L3 are respectively located between the first and second pixels 100 and 200, the first and third pixels 100 and 300, and the second and third pixels 200 and 300. Further, a gap of a fourth length L4 that is greater than the first, second and third lengths L1, L2, and L3 may be located between neighboring first pixels 100.

Thus, when the green organic emission layer, the blue organic emission layer, and the red organic emission layer respectively included in the first pixel 100, the second pixel 200, and the third pixel 300 are formed separately by a deposition process that uses a fine metal mask, deposition reliability may be improved.

In addition, since the plurality of second pixels 200 and the plurality of third pixels 300 are arranged to enclose the plurality of first pixels 100, an aperture ratio of each of the first, second, and third pixels 100, 200, and 300 may be increased. As a result, manufacturing times and costs of an organic light-emitting display apparatus may be reduced, while a quality of an image displayed by the organic light-emitting display apparatus may be improved.

In other words, according to the pixel array structure as described above, there is a wide distance between pixels emitting the same color of light so that deposition reliability is improved, and, there is a narrow distance between red, green, and blue pixels that form a sub-pixel so that an aperture ratio is improved.

As described above, in the pixel array structure of the organic light-emitting display apparatus 1, according to the present embodiment, each of the first pixels 100, the second pixels 200, and the third pixels 300 have a polygonal shape. In addition, during a deposition process of an organic emission layer, which is unique to the manufacture of an organic light-emitting display apparatus, deposition reliability of the organic emission layer can be improved while using the fine metal mask.

Further, the center point of the first pixel 100 is located at the center point of the virtual quadrangle VS, the center point of the second pixel 200 is located at the first vertex P1 of the virtual quadrangle VS, and the center point of the third pixel 300 is located at the second vertex P2 of the virtual quadrangle VS in order to improve the aperture ratio of each of the first, second, and third pixels 100, 200, and 300.

According to the pixel array structure of the organic light-emitting display apparatus 1 according to the present embodiment, each of the first, second, and third pixels 100, 200 and 300 emits a light of green, blue and red colors respectively. However, the pixel array structure of an organic light-emitting display apparatus according to another embodiment of the present invention is not limited thereto, and, the first, second, and third pixels 100, 200, and 300 may emit lights of different colors from the case of FIG. 2. For example, at least one of the second pixel 200 and the third pixel 300 may emit a white light.

In addition, the shapes of the first, second, and third pixels 100, 200 and 300 are not limited to what are illustrated in the drawings. For example, the first pixel 100, the second pixel 200, and the third pixel 300 may have various shapes including a circle, an oval, and/or a polygon. According to some embodiments, the first pixel 100 may have a quadrangular shape, and the second pixel 200 and the third pixel 300 may have octagonal shapes.

The spacer 41 is provided to protect display characteristics from being deteriorated due to an external shock. The spacer 41 may be regularly arranged in the non-emission region of the organic emission portion 22.

Generally, as an area of the spacer 41 in the non-emission region of the organic emission portion 22 increases, an effect of maintaining rigidity of the organic light-emitting display apparatus 1 against an external shock may increase. However, as the area of the spacer 41 increases, other problems may occur. For example, when the spacer 41 occupies too large of a portion of the non-emission region, stains may occur in the pixel due to external pressure. Also, when a size of the spacer 41 is too large, a reflow phenomenon in a process may increase so that a tilt angle of a side surface of the spacer 41 may be reduced, and thus, light reflection may occur due to a sloped surface of the spacer 41, thereby reducing light visibility of the organic light-emitting display apparatus 1. Therefore, the spacer 41 may be arranged by thoroughly considering the maintenance of rigidity, improvement regarding the stains, and the light reflection.

According to embodiments of the present invention, the spacer 41 may be arranged in consideration of those factors described above.

The spacer 41 may be disposed between the first pixel 100, the second pixel 200, and the third pixel 300 included in the plurality of pixel areas. In one embodiment, the spacer 41 is disposed between the first, second, and third pixels 100, 200, and 300 and pixels having the shortest distance from the first, second, and third pixels 100, 200, and 300 among pixels neighboring the first, second, and third pixels 100, 200, and 300.

According to some embodiments, the spacer 41 may be disposed between the first pixel 100 and at least one of the second pixel 200 and the third pixel 300 that are neighboring the first pixel 100.

According to some embodiments, there may be a plurality of spacers 41 in the organic emission portion 22, which may be arranged at regular intervals.

Referring to FIG. 2, the gap of the first length L1 exists between the first pixel 100 and the second pixel 200, the gap of the second length L2 exists between the first pixel 100 and the third pixel 300, and the gap of the third length L3 exists between the second pixel 200 and the third pixel 300. Also, the gap of the fourth length L4 exists between the first pixel 100 and another neighboring first pixel 100.

According to some embodiments, the distances between the pixels may satisfy a relational expression: L1=L2<L3<L4. In this case, the spacer 41 may be disposed between the first pixel 100 and the second pixel 200 and between the first pixel 100 and the third pixel 300.

According to some embodiments, the spacer 41 is disposed between the first pixel 100 and the second pixel 200, and may be formed to meet a boundary surface of the first pixel 100 and a boundary surface of the second pixel 200. This may be in order to reduce a reflow phenomenon when forming the spacer 41. Aspects with respect to this matter will be described later on.

According to some embodiments, the number of the spacers 41 connected to each of the pixels may be four.

Figure 3A:
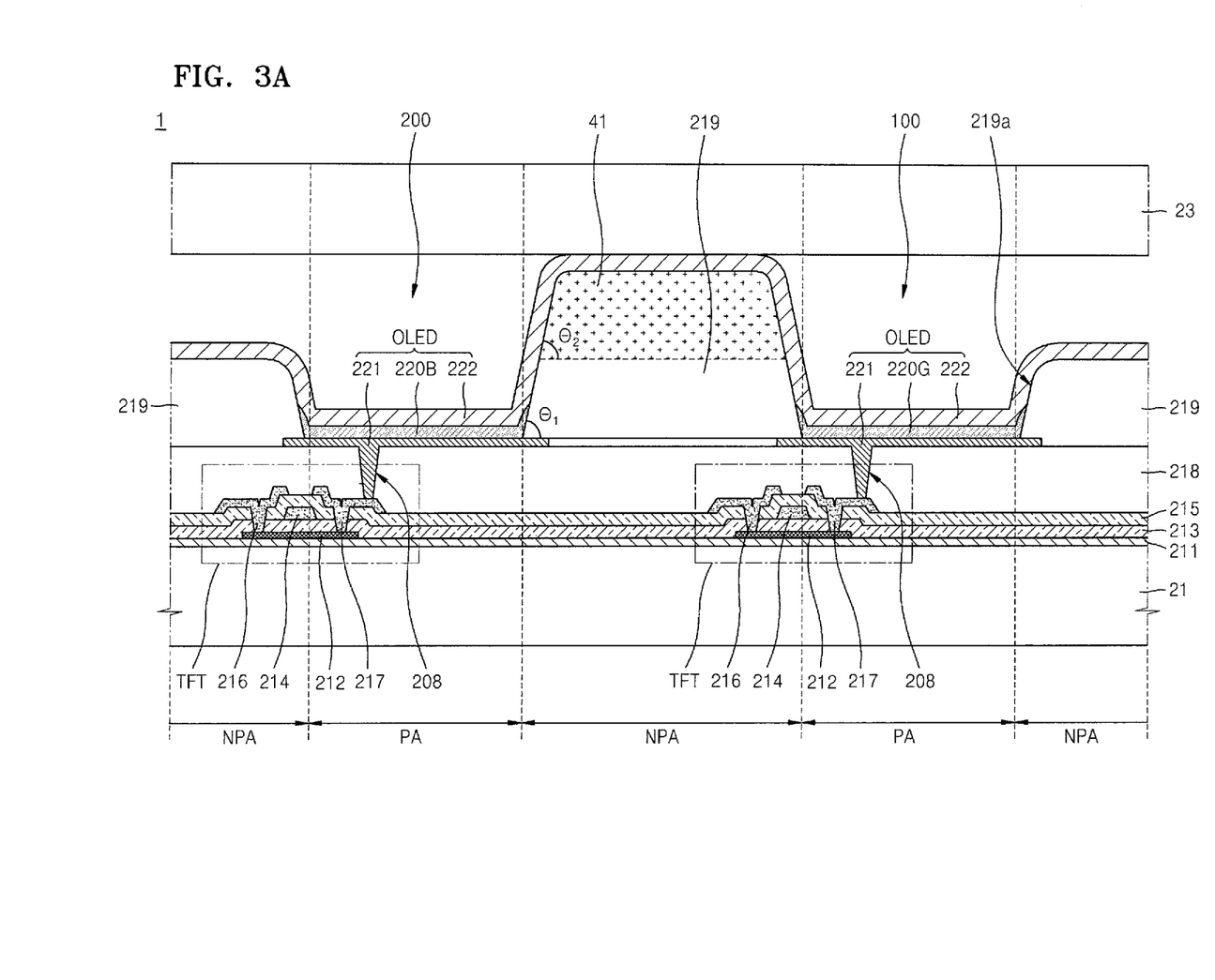
FIG. 3A is a cross-sectional view taken along a line I-I' of the organic light-emitting display apparatus of FIG. 2.

FIG. 3A is a partial cross-sectional view taken along a line I-I' of the organic light-emitting display apparatus 1 of FIG. 2.

Referring to FIG. 3A, the organic light-emitting display apparatus 1 may include the display substrate 21, the encapsulation substrate 23, a buffer layer 211, a thin film transistor (TFT) TFT, the OLED OLED, a pixel-defining layer 219, and the spacer 41.

The display substrate 21 includes the non-pixel area NPA and the plurality of pixel areas PA separated by the non-pixel area NPA. The display substrate 21 may be formed of a transparent glass material including mainly $SiO_2$. The display substrate 21 is not limited thereto, and substrates of various materials including a ceramic, a transparent plastic, or a metal may be used.

The encapsulation substrate 23 is facing the display substrate 21 and may function to shield the OLED OLED between the display substrate 21 and the encapsulation substrate 23 from external air.

The buffer layer 211 may prevent diffusion of impurity ions on a top surface of the display substrate 21, prevent penetration of water and foreign materials, and planarize the top surface of the display substrate 21. According to some embodiments, the buffer layer 211 may be formed of an inorganic material, such as silicon oxide (SiOx), silicon nitride (SiNx), silicon oxynitride (SiON), aluminum oxide (AlO), aluminum nitride (AlON), titanium oxide (TiOx), and titanium nitride (TiNx), an organic material, such as polyimide (PI), polyester, and acryl, or a stack of the organic material and the inorganic material. The buffer layer 211 is not an essential component and may not be provided when necessary. The buffer layer 211 may be formed by various deposition methods including plasma enhanced chemical vapor deposition (PECVD), atmospheric pressure CVD (APCVD), and low pressure CVD (LPCVD).

The TFT TFT is formed of an active layer 212, a gate electrode 214, a source electrode 216, and a drain electrode 217. A gate insulating layer 213 is interposed between the gate electrode 214 and the active layer 212 to insulate therebetween.

The active layer 212 may be provided on the buffer layer 211. The active layer 212 may include an inorganic semiconductor, such as amorphous silicon or polysilicon, or an organic semiconductor. According to some embodiments, the active layer 212 may be formed of an oxide semiconductor. For example, the oxide semiconductor may include oxide of a material selected from metallic elements in group 12, 13, and 14, such as Zn, In, Ga, Sn, Cd, Ge, or Hf, or a combination thereof.

The gate insulating layer 213 is provided on the buffer layer 211 to cover the active layer 212. The gate electrode 214 is on the gate insulating layer 213.

An interlayer insulating layer 215 is on the gate insulating layer 213 to cover the gate electrode 214. The source electrode 216 and the drain electrode 217 are on the interlayer insulating layer 215 and contact the active layer 212 through a contact hole.

A structure of the TFT is not limited to the structure described above, and various TFT structures may be applied. For example, although the TFT TFT described above is a top gate structure, the TFT TFT may also be a bottom gate structure in which the gate electrode 214 is disposed under the active layer 212.

A pixel circuit (not shown) including a capacitor together with the TFT TFT may be formed.

A planarization layer 218 covering the pixel circuit including the TFT TFT is provided on the interlayer insulating layer 215. The planarization layer 218 may function to remove a step portion of and planarize the interlayer insulating layer 215 in order to increase an emission efficiency of the OLED OLED provided on the interlayer insulating layer 215.

The planarization layer 218 may be formed of an inorganic material and/or an organic material. For example, the planarization layer 218 may include a photoresist, an acryl-based polymer, a polyimide-based polymer, a siloxane-based polymer, a polymer including a photosensitive acryl carboxyl group, a novolak resin, an alkali developable resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, or zirconium oxide.

The OLED OLED is disposed on the planarization layer 218 and includes a first electrode 221, an intermediate layer 220B and 220G, and a second electrode 222. The pixel-defining layer 219 is disposed on the planarization layer 218 and the first electrode 221 and defines the pixel area PA and the non-pixel area NPA.

The intermediate layer 220B and 220G may be formed of a small molecular weight organic material or a high molecular weight organic material. When the small molecular weight organic material is used, the intermediate layer 220B and 220G may include an organic emission layer. Also, in addition to the organic emission layer, the intermediate layer 220B and 220G may include at least one of a hole injection layer HIL, a hole transport layer HTL, an electron transport layer ETL, and an electron injection layer EIL. The present embodiment is not limited thereto, and the intermediate layer 220B and 220G may include the organic emission layer and other layers of various functions. The small molecular weight organic material may be formed by vapor deposition. Here, the emission layer may be formed in each of red R, green G, and blue B pixels, and, the HIL, the HTL, the ETL, and the EIL are common layers and may be commonly applied to the red R, green G, and blue B pixels.

When the intermediate layer 220B and 220G is formed of the high molecular weight organic material, only the HTL may be included in a direction toward the first electrode 221 based on the organic emission layer. The HTL may be on an upper portion of the first electrode 221 by inkjet printing or spin coating by using PEDOT: poly-(2,4)-ethylene-dihydroxy thiophene, or PANI: polyaniline. In one embodiment, the high molecular weight organic material, such as polyphenylenevinylene (PPV) and polyfluorene, may be used as an organic material, and a color pattern may be formed in an ordinary way by inkjet printing, spin coating, or a heat transfer method using a laser.

In the drawings, the second pixel 200 and the first pixel 100 may include the intermediate layer 200B and 200G emitting different colors of light.

The first electrode 221 may be on the planarization layer 218 and electrically connected to the drain electrode 217 of the TFT TFT through a penetration hole 208 penetrating the planarization layer 218.

The first electrode 221 may function as an anode electrode, and the second electrode 222 may function as a cathode electrode. However, it is not limited thereto, and the polarities of the first and second electrodes 221 and 222 may be switched.

When the first electrode 221 functions as the anode electrode, the first electrode 221 may include ITO, IZO, ZnO, or $In_2O_3$ having a high work function. When the organic light-emitting display apparatus 1 is a top-emission type in which an image is realized in a direction opposite to the display substrate 21, the first electrode 221 may further include a reflective layer including Ag, Mg, Al, Pt, Pd, Au, Ni, Nd, Ir, Cr, Li, Yb, or Ca. The above materials may be used alone or in combination. Also, the first electrode 221 may be formed as a single layered structure or a multi-layered structure including the metal and/or alloys described above. According to some embodiments, the first electrode 221 is a reflection electrode and may include an ITO/Ag/ITO structure.

When the second electrode 222 functions as the cathode electrode, the second electrode 222 may be formed of a metal including Ag, Mg, Al, Pt, Pd, Au, Ni, Nd, Ir, Cr, Li, or Ca. When the organic light-emitting display apparatus 1 is the top-emission type, the second electrode 222 may be provided to enable transmission of light. According to some embodiments, the second electrode 222 may include transparent conductive metal oxide, such as ITO, IZO, ZTO, ZnO, or $In_2O_3$.

According to another embodiment, the second electrode 222 may be formed as a thin layer including at least one material selected from Li, Ca, LiF/Ca, LiF/Al, Al, Ag, Mg, and Yb. For example, the second electrode 222 may be formed as a single layer or a stack including Mg:Ag, Ag:Yb, and/or μg. The second electrode 222 may be formed such that a common voltage may be applied to all pixels unlike the first electrode 221.

The pixel-defining layer 219 includes a plurality of openings exposing the first electrode 221 and defines the pixel area PA and the non-pixel area NPA of the OLED OLED. The first electrode 221, the intermediate layer 220B and 220G, and the second electrode 222 are sequentially stacked in an opening 219a of the pixel-defining layer 219 so that the intermediate layer 220B and 220G including the organic emission layer may emit light. In other words, a portion in which the pixel-defining layer 219 is formed may be substantially the non-pixel area NPA, and the opening 219a of the pixel-defining layer 219 may be substantially the pixel-region PA.

The spacer 41 is provided on the pixel-defining layer 219. The spacer 41 may protrude in a direction of the encapsulation layer 23 from the pixel-defining layer 219.

According to some embodiments, the pixel-defining layer 219 and the spacer 41 may be integrally formed by a photo process or a photo etch process by using a photosensitive material.

First, a photosensitive organic layer may be spread to form the pixel-defining layer 219 and the spacer 41, and then, after light is exposed by controlling an amount of exposure by an exposure process using a half-tone mask, the pixel-defining layer 219 and the spacer 41 may be patterned by a developing process.

According to some embodiments of the present invention, the half-tone mask may be formed of a transmittance region, a half-transmittance region, and an impermeable region. The opening 219a of the pixel-defining layer 219 may be formed in correspondence to the transmittance region of the half-tone mask. The pixel-defining layer 219 and the spacer 41 may be formed in correspondence to the half-transmittance region and the impermeable region, respectively. In this case, the spacer 41 may be formed of the same material as the pixel-defining layer 219.

Then, the pixel-defining layer 219 and the spacer 41 are manufactured by being cured at a predetermined temperature. In this process, a reflow phenomenon of the spacer 41 may occur. In other words, molecular arrays of the pixel-defining layer 219 and the spacer 41 may be changed during the curing process, and, in this process, a shape of the spacer 41 may be changed. The reflow phenomenon may occur to a greater degree, when the spacer 41 has a large size and the spacer 41 and the pixel-defining layer 219 form a step portion.

According to some embodiments, the curing process may be performed at a temperature from 200° C. to 300° C. for 30 minutes to two hours. To reduce the reflow phenomenon, a condition of the curing process may be changed. However, there is a limit in reducing the reflow phenomenon by changing the curing temperature and time.

According to some embodiments, the spacer 41 and the pixel-defining layer 219 may not form the step portion. In other words, a sloped surface of the spacer 41 may be formed by extending from a sloped surface of the opening 219a of the pixel-defining layer 219. Accordingly, a tilt angle $\theta_2$ of a side surface of the spacer 41 may be substantially the same as a tilt angle $\theta_1$ of the opening 219a of the pixel-defining layer 219.

Figure 3B:
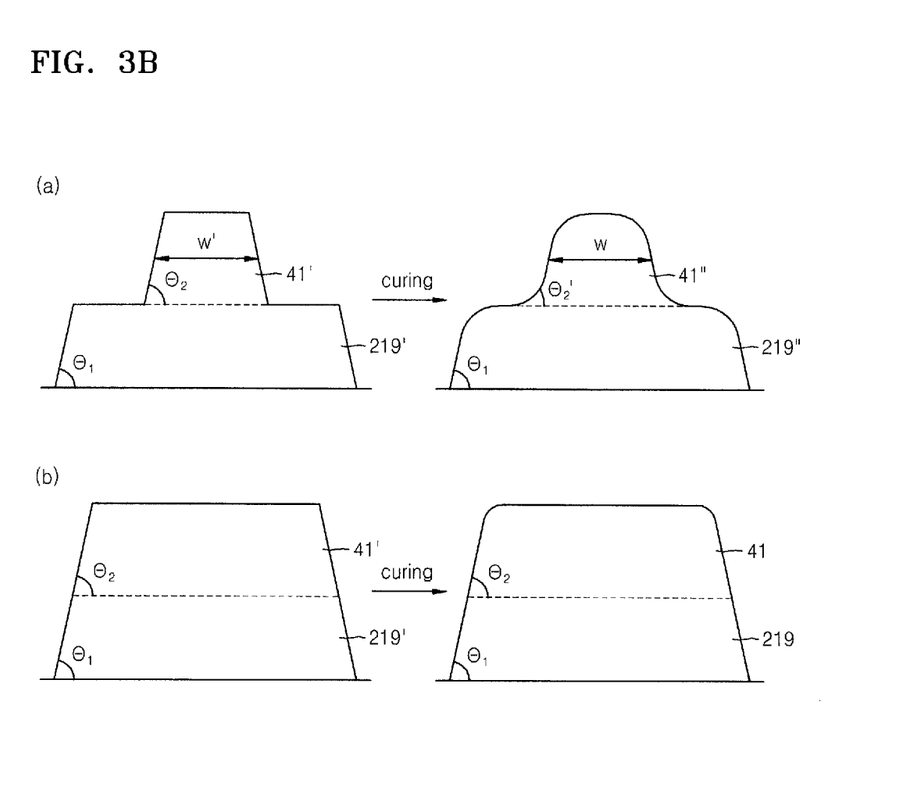
FIG. 3B is a view for describing a change of a tilt angle of a side surface due to a curing process according to another embodiment of the present invention.

FIG. 3B (a) and (b) illustrate an example of a transformation of the spacer 41 according to the reflow phenomenon.

FIG. 3B (a) illustrates a case in which a pixel-defining layer 219" and a spacer 41" form a step portion, and FIG. 3B (b) illustrates a case in which the pixel-defining layer 219'" and the spacer 41 do not form the step portion.

In the case of FIG. 3B (b), a tilt angle $\theta_2$ of a side surface of the spacer pattern 41' may have substantially the same value as a tilt angle $\theta_1$ of a side surface of the pixel-defining layer 219'.

The tilt angle $\theta_1$ of the side surface of the pixel-defining pattern 219' may barely change after the curing process. This may be because a material existing under the pixel-defining pattern 219' may be different from a material of the pixel-defining pattern 219'.

However, the spacer pattern 41' may be formed of the same material as the pixel-defining pattern 219', and thus, the spacer pattern 41' and the pixel-defining pattern 219' may interact with each other by the curing process and change their forms. Accordingly, a tilt angle $\theta_2$' of a side surface of a spacer 41" may become smaller than the tilt angle $\theta_2$ of the side surface of the spacer 41', and, the distribution of the tilt angle $\theta_2$' may vary. Also, a width w of the spacer 41" may become greater than a width w' of the spacer pattern 41'. As shown above, the change of the tilt angle and/or the width caused by the curing process may be referred to as the reflow phenomenon.

The tilt angle $\theta_2$ of the side surface of the spacer 41', which is decreased by the reflow phenomenon, may cause an increase in a reflection of a light incident from the outside.

In the case of FIG. 3B (b), the spacer pattern 41' and the pixel-defining pattern 219' do not form the step portion. In other words, a boundary of the opening 219a of the pixel-defining pattern 219' meets the side surface of the spacer pattern 41'.

In this case, since the spacer pattern 41' and the pixel-defining pattern 219' do not form the step portion, the reflow phenomenon by the curing process may be reduced. In other words, the tilt angle $\theta_2$ of the side surface of the spacer 41 may be substantially the same as the tilt angle $\theta_1$ of the side surface of the pixel-defining layer 219.

Referring again to FIGS. 2, 3A, and 3B, the spacer 41 may be met with the boundary surfaces of the first, second, and third pixels 100, 200, and 300 to reduce the reflow phenomenon. Also, the spacer 41 may be disposed between the first pixel 100 and a pixel that is most adjacent to the first pixel 100 among pixels neighboring the first pixel 100 to reduce the reflow phenomenon by reducing the size of the spacer 41. At the same time, the spacer 41 may be regularly arranged in the organic emission portion 22 so that rigidity may be maintained even when external shocks are applied.

Figure 4:
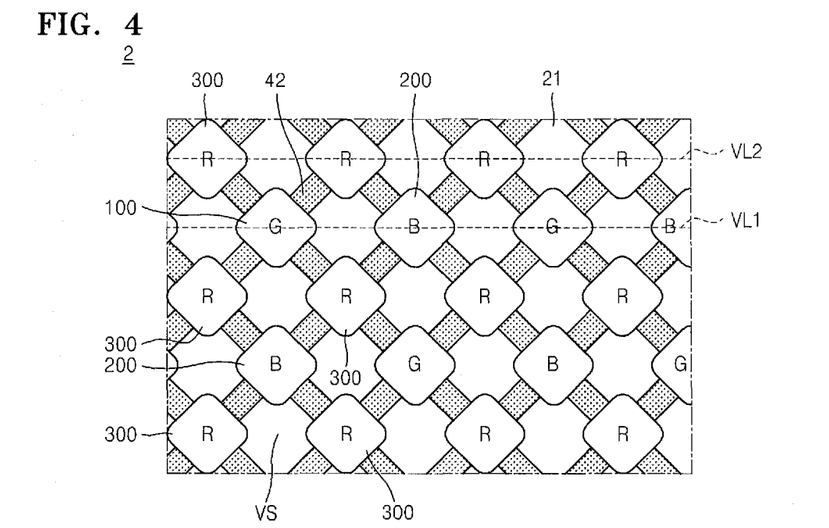
FIG. 4 is a partial plan view of an organic light-emitting display apparatus according to another embodiment of the present invention.

FIG. 4 is a partial plan view of an organic light-emitting display apparatus 2 according to another embodiment of the present invention. In FIG. 4, like reference numerals denote like elements as found in FIG. 2, and their descriptions will be omitted for brevity of explanation.

Referring to FIG. 4, the organic light-emitting display apparatus 2 is different from the organic light-emitting display apparatus 1 of FIG. 2 in that the organic light-emitting display apparatus 2 has a different pixel arrangement.

The plurality of pixel areas of the organic light-emitting display apparatus 2 include the plurality of first pixels 100, the plurality of second pixels 200, and the plurality of third pixels 300. The first pixel 100, the second pixel 200, and the third pixel 300 may have substantially the same areas as each other.

According to an embodiment of the present invention, the first pixel 100 may emit a green light, the second pixel 200 may emit a blue light, and the third pixel 300 may emit a red light.

The plurality of first pixels 100 and the plurality of second pixels 200 are alternately arranged on the first virtual straight line VL1. The plurality of third pixels 300 are arranged on the second virtual straight line VL2, while being spaced from one another.

The first virtual straight line VL1 and the second virtual straight line VL2 are spaced from each other in parallel, and are alternately arranged. The plurality of third pixels 300 are arranged out of line with the plurality of first pixels 100 and the plurality of second pixels 200 in a direction perpendicular to the first virtual straight line VL1 and the second virtual straight line VL2.

A spacer 42 may be disposed between the first pixel 100, the second pixel 200, and the third pixel 300 included in the plurality of pixel areas. Here, the spacer 42 is disposed between the first, second, and third pixels 100, 200, and 300 and pixels having the shortest distance from the first, second, and third pixels 100, 200, and 300 among pixels neighboring the first, second, and third pixels 100, 200, and 300.

According to some embodiments, the spacer 42 may be disposed between the first pixel 100 and the third pixel 300 adjacent to the first pixel 100. According to some embodiments, the spacer 42 may be disposed between the second pixel 200 and the third pixel 300 adjacent to the second pixel 200.

According to some embodiments, a plurality of spacers 42 may be in the organic emission portion 22, while being regularly arranged.

The spacer 42 may be disposed between the first pixel 100 and the third pixel 300 and may be formed to meet a boundary surface of the first pixel 100 and a boundary surface of the third pixel 300. The spacer 42 may be disposed between the second pixel 200 and the third pixel 300 and may be formed to meet a boundary surface of the second pixel 200 and the boundary surface of the third pixel 300.

Figure 5:
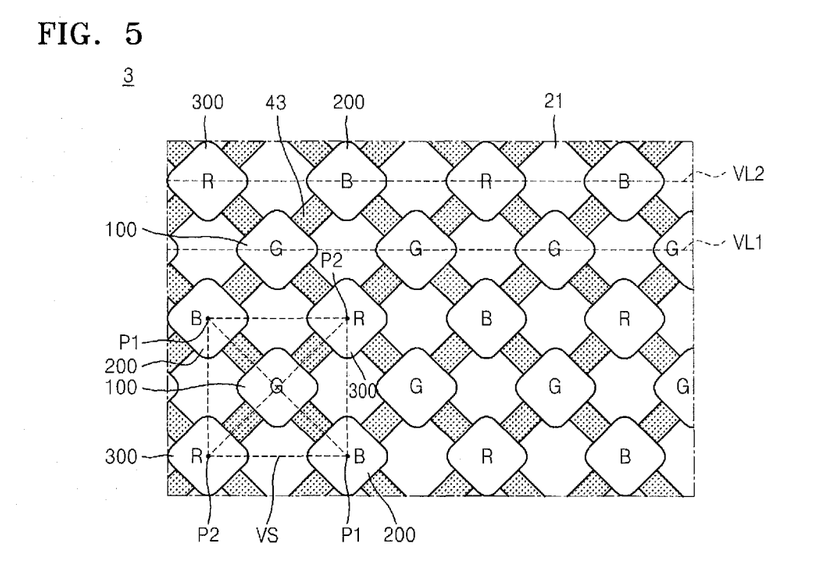
FIG. 5 is a partial plan view of an organic light-emitting display apparatus according to another embodiment of the present invention.

FIG. 5 is a partial plan view of an organic light-emitting display apparatus 3 according to another embodiment of the present invention. In FIG. 5, like reference numerals denote like elements as found in FIGS. 2 and 4, and their descriptions will not be repeated here for brevity of explanation.

Referring to FIG. 5, the organic light-emitting display apparatus 3 of FIG. 5 is different from the organic light-emitting display apparatus 1 of FIG. 2 in that the first pixel 100 has substantially the same size as the second pixel 200 and the third pixel 300. This structure may correspond to a Bayer pattern.

A spacer 43 may be disposed between the first, second and third pixels 100, 200, and 300 included in the plurality of pixel areas. In one embodiment, the spacer 43 is disposed between the first, second, and third pixels 100, 200, and 300 and pixels having the shortest distance from the first, second, and third pixels 100, 200, and 300 among pixels neighboring the first, second, and third pixels 100, 200, and 300.

According to some embodiments, the spacer 43 may be disposed between the first pixel 100 and at least one of the second pixel 200 and the third pixel 300 neighboring the first pixel 100.

According to some embodiments, a plurality of the spacer 43 may be in the organic emission portion 22, while being regularly arranged.

As shown above, the arrangement structure of the spacers 41, 42, and 43 may apply to any structure in which the spacers 41, 42, and 43 may be disposed between the plurality of first pixels 100, the plurality of second pixels 200, and the plurality of third pixels 300. For example, the arrangement structure of the spacers 41, 42, and 43 may apply to a pentile structure, an RGB quad arrangement structure, an RGB delta arrangement structure, a Bayer pattern structure, or a structure transformed from these structures.

Figure 6:
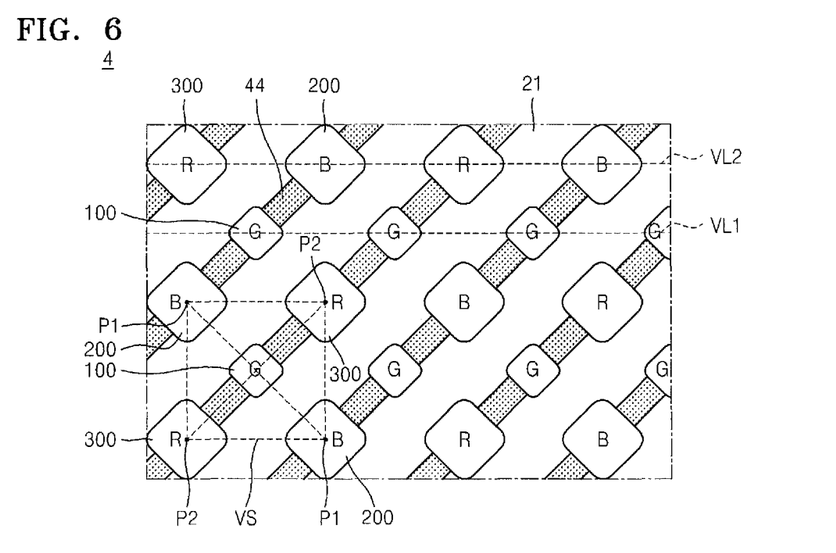
FIG. 6 is a partial plan view of an organic light-emitting display apparatus according to another embodiment of the present invention.

FIG. 6 is a partial plan view of an organic light-emitting display apparatus 4 according to another embodiment of the present invention. In FIG. 6, like reference numerals denote like elements as found in FIGS. 2, 4, and 5, and their descriptions will not be repeated here for brevity of explanation.

Referring to FIG. 6, the number of spacers 44 connected to each of the pixels 100, 200, and 300 is two, according to the organic light-emitting display apparatus 4 of FIG. 6, and the two spacers 44 are arranged in a diagonal direction based on one pixel.

The number of spacers 44 may be reduced in consideration of a limit of rigidity against external shocks. Even if the number of spacers 44 is reduced, sufficient rigidity against external shocks may be maintained due to a regular arrangement.

Figure 7:
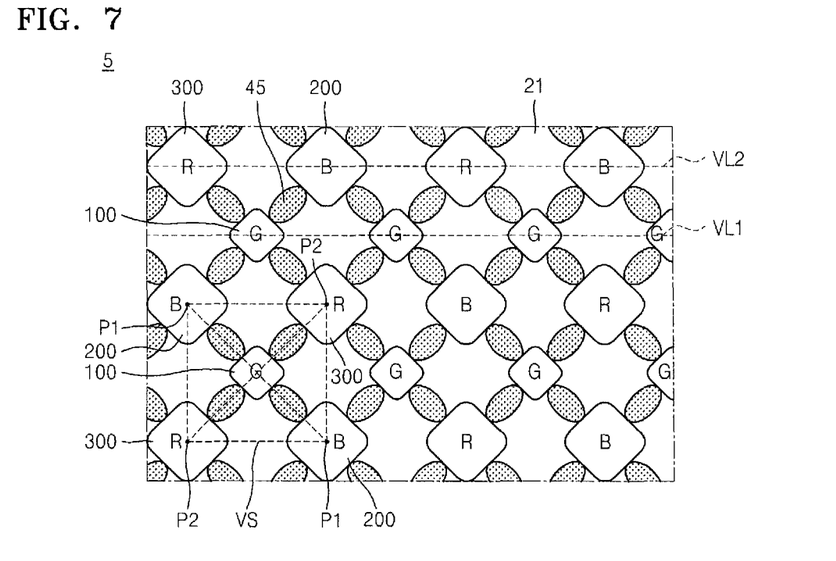
FIG. 7 is a partial plan view of an organic light-emitting display apparatus according to another embodiment of the present invention.
Figure 8:
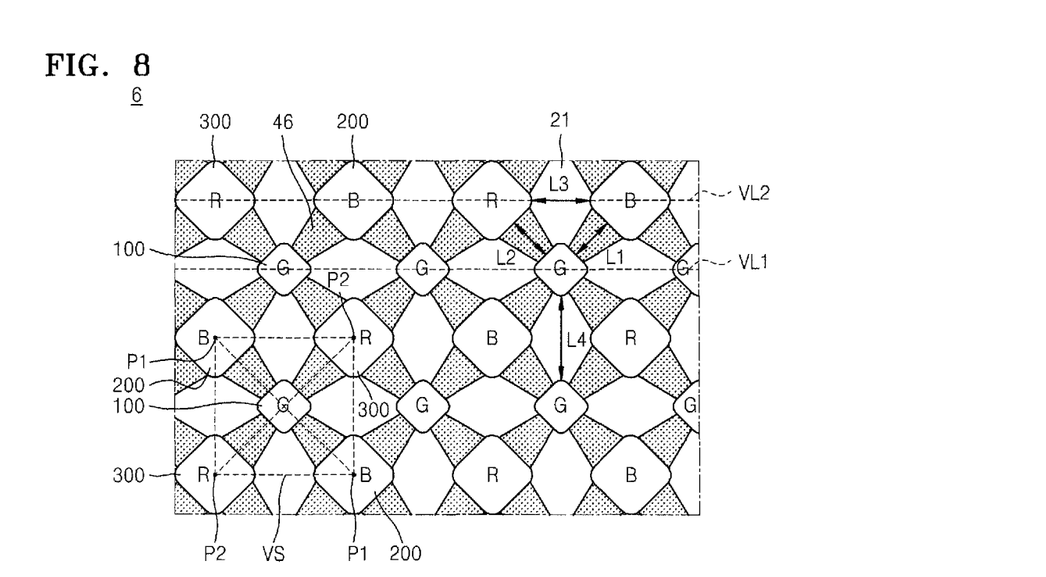
FIG. 8 is a partial plan view of an organic light-emitting display apparatus according to another embodiment of the present invention.
Figure 9:
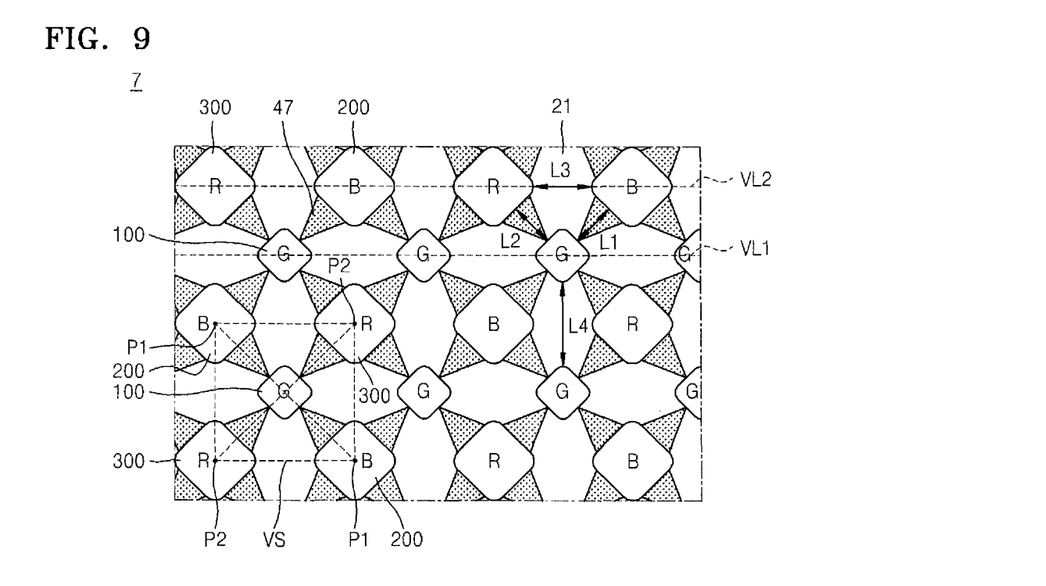
FIG. 9 is a partial plan view of an organic light-emitting display apparatus according to another embodiment of the present invention.

FIGS. 7 through 9 are partial plan views of organic light-emitting display apparatuses 5, 6, and 7, according to other embodiments of the present invention. In FIGS. 7 through 9, like reference numerals denote like elements as found in FIGS. 2, 4, 5, and 6, and their descriptions will not be repeated here for brevity of explanation.

Referring to FIGS. 7 through 9, the organic light-emitting display apparatuses 5, 6, and 7 according to the present embodiments are different from the organic light-emitting display apparatus 1 of FIG. 2 in that top views of spacers 45, 46, and 47 are different from a top view of the spacer 41 of the organic light-emitting display apparatus 1 of FIG. 2.

The top view of the spacer 45 of FIG. 7 is an oval shape, and the top view of the spacer 46 of FIG. 8 is a ladder shape. The top view of the spacer 47 of FIG. 9 is a triangular shape. Shapes of the spacers 45, 46, and 47 are not limited thereto, and may vary.

The spacers 45, 46, and 47 may be disposed between the first, second, and third pixels 100, 200, and 300 included in the plurality of pixel areas. Here, the spacers 45, 46, and 47 are disposed between the first, second, and third pixels 100, 200, and 300 and pixels having the shortest distance from the first, second, and third pixels 100, 200, and 300 among pixels neighboring the first, second, and third pixels 100, 200, and 300.

According to some embodiments, the spacers 45, 46, and 47 may be disposed between the first pixel 100 and the third pixel 300 neighboring the first pixel 100.

According to some embodiments, the spacers 45, 46, and 47 may be disposed between the second pixel 200 and the third pixel 300 neighboring the second pixel 200.

According to some embodiments, a plurality of each of the spacers 45, 46, and 47 may be in the organic emission portion 22, while being regularly arranged.

The spacers 45, 46, and 47 may be disposed between the first pixel 100 and the third pixel 300 and may be formed to meet a boundary surface of the first pixel 100 and a boundary surface of the third pixel 300. The spacers 45, 46, and 47 may be disposed between the second pixel 200 and the third pixel 300 and may be formed to meet a boundary surface of the second pixel 200 and the boundary surface of the third pixel 300.

As described above, according to the one or more of the above embodiments of the present invention, the organic light-emitting display apparatuses 1, 2, 3, 4, 5, 6, and 7 have the arrangement structure of the spacers 41, 42, 43, 44, 45, 46, and 47 that may be rigid against external shocks, may improve stains, and may reduce light reflection, and thus, reliability of the organic light-emitting display apparatuses 1, 2, 3, 4, 5, 6, and 7 may be improved.

It should be understood that the exemplary embodiments described herein are presented in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of embodiments of the present invention as defined by the following claims and their equivalents.

What is claimed is:

1. An organic light-emitting display apparatus comprising:
   a display substrate comprising a non-pixel area and a plurality of pixel areas comprising a first pixel and a second pixel adjacent to the first pixel, the first pixel and the second pixel being arranged along a first direction;
   an encapsulation substrate facing the display substrate;
   a plurality of spacers in the non-pixel area of the display substrate to maintain a space between the display substrate and the encapsulation substrate; and
   a pixel-defining layer defining the plurality of pixel areas and the non-pixel area and having openings for exposing the plurality of pixel areas,
   wherein each of the plurality of spacers have an island shape,
   wherein the first pixel has adjacent ones of the plurality of spacers having a same shape and being located in and elongated in, with respect to the first pixel, each of the first direction, a second direction crossing the first direction, a direction opposite to the first direction, and a direction opposite to the second direction, and
   wherein a sloped surface each of the spacers extends from a sloped surface of one of the openings of the pixel-defining layer, and wherein the sloped surface each of the spacers and the sloped surface of one of the openings do not form a step portion.

2. The organic light-emitting display apparatus of claim 1, wherein the plurality of pixel areas further comprises a third pixel,
   wherein the second pixel has a center point at a first vertex of a virtual quadrangle,
   wherein a center point of the first pixel is a center point of the virtual quadrangle,
   wherein the third pixel has a center point at a second vertex of the virtual quadrangle, and
   wherein the second vertex neighbors the first vertex.

3. The organic light-emitting display apparatus of claim 2, wherein a distance between the first pixel and the second pixel is substantially the same as a distance between the first pixel and the third pixel, and
   wherein one of the spacers is between the first pixel and the third pixel.

4. The organic light-emitting display apparatus of claim 2, wherein the second pixel is one of a plurality of second pixels of the plurality of pixel areas, wherein the third pixel is one of a plurality of third pixels of the plurality of pixel areas, and wherein the plurality of second pixels and the plurality of third pixels are alternately arranged on a virtual straight line.

5. The organic light-emitting display apparatus of claim 2, wherein each of the first, second, and third pixels emits a different color of light.

6. The organic light-emitting display apparatus of claim 2, wherein the first pixel emits a green light, and has a smaller area than the second pixel and the third pixel.

7. The organic light-emitting display apparatus of claim 1, wherein the plurality of spacers comprise the same material as the pixel-defining layer.

8. The organic light-emitting display apparatus of claim 1, wherein one of the spacers meets a boundary surface of the first pixel and a boundary surface of the second pixel.

9. The organic light-emitting display apparatus of claim 1, wherein a shape of a top view each of the spacers comprises at least one of a polygon, a circle, and an oval.

10. The organic light-emitting display apparatus of claim 1, wherein the second pixel is one of a plurality of second pixels of the plurality of pixel areas, and wherein the plurality of second pixels are spaced from one another with the first pixel therebetween.

11. The organic light-emitting display apparatus of claim 1, wherein the plurality of spacers are regularly arranged.

12. An organic light-emitting display apparatus comprising:

a display substrate comprising a plurality of pixel areas and a non-pixel area;

an encapsulation substrate facing the display substrate; and a plurality of spacers in the non-pixel area to maintain a space between the display substrate and the encapsulation substrate, wherein the plurality of pixel areas comprises a plurality of pixels comprising:

a first pixel;

a second pixel comprising a center point at a first vertex of a virtual quadrangle comprising a center point that is the same as a center point of the first pixel; and a third pixel that is spaced from the second pixel and has a center point at a second vertex of the virtual quadrangle wherein the second vertex is neighboring the first vertex, and wherein one of the spacers is between the first pixel and at least one of the second pixel and the third pixel that are neighboring the first pixel, wherein the second pixel is adjacent to the first pixel and the first pixel and the second pixel are arranged along a first direction, and wherein the plurality of spacers each have an island shape, and wherein the first pixel has adjacent ones of the plurality of spacers having a same shape and being located in and elongated in, with respect to the first pixel, each of the first direction, a second direction crossing the first direction, a direction opposite to the first direction, and a direction opposite to the second direction.

13. The organic light-emitting display apparatus of claim 12, wherein each of the adjacent ones of the plurality of spacers meets a boundary surface of the first pixel.

14. The organic light-emitting display apparatus of claim 12, further comprising a pixel-defining layer in the non-pixel area of the display substrate and comprising a plurality of openings through which the plurality of pixels are exposed.

15. The organic light-emitting display apparatus of claim 14, wherein the plurality of spacers extends toward the encapsulation substrate from the pixel-defining layer.

16. The organic light-emitting display apparatus of claim 14, wherein a sloped surface of the each of the plurality of spacers extends from a sloped surface of one of the openings of the pixel-defining layer.

17. The organic light-emitting display apparatus of claim 14, wherein the plurality of spacers comprises the same material as the pixel-defining layer.

18. The organic light-emitting display apparatus of claim 14, wherein the plurality of spacers and the pixel-defining layer are simultaneously formed using a half tone process.

* * * * *